United States Patent [19]

Noda et al.

[11] Patent Number: 4,913,955
[45] Date of Patent: Apr. 3, 1990

[54] EPOXY RESIN LAMINATE

[75] Inventors: Masayuki Noda; Kenichi Kariya; Takahiro Yamaguchi; Katsuji Takahashi, all of Hikone, Japan

[73] Assignee: Shin-Kobe Electric Machinery Co., Ltd., Tokyo, Japan

[21] Appl. No.: 201,684

[22] Filed: Jun. 2, 1988

[30] Foreign Application Priority Data

| Jun. 5, 1987 | [JP] | Japan | 62-141196 |
| Jun. 5, 1987 | [JP] | Japan | 62-141197 |
| Jun. 5, 1987 | [JP] | Japan | 62-141198 |
| Sep. 29, 1987 | [JP] | Japan | 62-244573 |
| Mar. 9, 1988 | [JP] | Japan | 63-55560 |

[51] Int. Cl.$^4$ ............ B32B 15/08; B32B 15/14; B32B 17/10; B32B 17/12; H05K 1/03
[52] U.S. Cl. .................. 428/236; 156/630; 156/632; 156/901; 156/902; 174/254; 428/239; 428/251; 428/417; 428/418; 428/542.8; 428/901; 428/902
[58] Field of Search ............ 428/236, 251, 901, 239

[56] References Cited

U.S. PATENT DOCUMENTS

| 4,451,317 | 5/1984 | Oizumi et al. | 428/251 |
| 4,792,479 | 12/1988 | Marchetti et al. | 428/236 |
| 4,803,115 | 2/1989 | Fushiki et al. | 428/251 |
| 4,822,832 | 4/1989 | Chu et al. | 428/901 |

FOREIGN PATENT DOCUMENTS

| 10864 | 1/1978 | Japan . |
| 224941 | 9/1988 | Japan . |
| 2137425 | 10/1984 | United Kingdom . |

Primary Examiner—James C. Cannon
Attorney, Agent, or Firm—Pearne, Gordon, McCoy & Granger

[57] ABSTRACT

An epoxy resin laminate comprising a center base layer of glass fiber woven cloth and outer base layers of sheet-like material more expansible and compressible than glass fiber woven cloth provided on both faces of the center base layer and integrally impregnated with composite produced by reacting polybutadiene-acrylonitrile copolymer having carboxyl groups at its terminal with epoxy resin having more than two functional groups.

14 Claims, 1 Drawing Sheet

EPOXY RESIN LAMINATE

BACKGROUND OF THE INVENTION

In prior art, some hard printed circuit boards for an electronic instrument are electrically connected by flexible printed wiring boards or leads having a connector or connectors provided thereto. However, such connection causes erroneous wirings or increase in connecting steps. In order to delete such flexible wiring boards or leads having the connector or connectors provided thereto so as to solve such a problem has been proposed flexible laminate comprising a base of polyester nonwoven cloth including glass fiber impregnated with epoxy resin as disclosed by Japanese Patent Application Laying-Open No. 184,587/1984. However, the laminate has an insufficient size stability on production of the printed circuit board from the base of nonwoven cloth and therefore it is not suitable for high density printed circuit board. Also, the prior art never discloses what sort of epoxy resin is used for providing a bendable laminate.

A flexible laminate comprising glass fiber woven cloth impregnated with flexible epoxy resin has a good size stability because of low expansion of glass fiber, but it has no characteristic of holding the configuration which is provided by bending it.

A flexible laminate comprising organic fiber nonwoven cloth impregnated with flexible epoxy resin has a good bending characteristic, but a worse size stability on production of the printed circuit board, which causes the printed circuit to be ineffectively produced. Also, this laminate disadvantagously has high flexion on provision of electronic devices thereon due to its low bending elasticity.

SUMMARY OF THE INVENTION

Accordingly, it is a principal object of the invention to provide a bendable laminate adapted to have an improved size stability and to have low flexion on provision of electronic devices thereon.

It is another object of the invention to provide a laminate adapted to have an excellent chemical resistance and high strength of bonding to a metal foil, which allows electronic devices to be mounted at high density.

It is further object of the invention to provide a laminate adapted to have low flexion on treatment by soft solder at high temperature.

In accordance with one aspect of the present invention, there is provided an epoxy resin laminate comprising a center base layer of glass fiber woven cloth and outer base layers of sheet-like material more expansible and compressible than said glass fiber woven cloth provided on both faces of said center base layer and integrally impregnated with a composition produced by reacting 5 to 60 weight parts of polybutadiene-acrylonitrile copolymer having carboxyl groups at its terminal with 95 to 40 weight parts of epoxy resin having more than two functional groups.

In accordance with another aspect of the present invention, there is provided an epoxy resin laminate comprising; a center base layer of glass fiber woven cloth impregnated with epoxy resin having more than two functional groups;

and outer base layers of sheet-like material more expansible and compressible than said glass fiber woven cloth provided on both faces of said center base layer and integrally impregnated with a composition produced by reacting 5 to 60 weight parts of polybutadiene-acrylonitrile copolymer having carboxyl groups at its terminal with 95 to 40 weight parts of epoxy resin having more than two functional groups.

In general, in order to provide flexibility to epoxy resin composite, it is used while blended with epoxidated dimer acid, epoxidated polyisoprene, epoxidated polypropylene or the like. However, as the additive increases, strength of removal of a metal foil out of the laminate, chemical resistance and thermal resistance are lowered. This means that much additive cannot be added. However, in general, it is understood that much epoxy resin is required in order to make the laminate bendable.

The inventors have found that epoxy resin compositions produced by reacting polybutadiene-acrylonitrile copolymer having carboxyl groups at its terminal with epoxy resin having more than two functional groups has a good adhesion to the glass fiber woven cloth and the sheet-like bases more expansible and compressive than the glass fiber woven cloth and has enough flexibility provided thereto without deteriorating strength of removal of metal foil, chemical resistance and thermal resistance. On the other hand, the inventors has found that mixture of polybutadiene-acrylonitrile copolymer having carboxyl groups at its terminal and epoxy resin having more than two functional groups without any reaction thereof has strength of removal of metal foil, chemical resistance and thermal resistance poorer than those of the aforementioned composite.

If the weight parts of polybutadiene-acrylonitrile copolymer is lower than 5, then the laminate has no enough characteristic of holding the configuration which is provided by bending it. If the weight parts of polybutadiene-acrylonitrile copolymer is higher than 60, then chemical resistance, strength of removal of metal foil and thermal resistance are deteriorated. The ratio of inclusion of acrylonitrile in polybutadiene-acrylonitrile copolymer may be preferably 10 through 25%. If the ratio of acrylonitrile is lower than 10%, then its phase solubility with epoxy resin is deteriorated, which causes epoxy resin composite to have turbidity generated. This cannot provides a good laminate. If the ratio of acrylonitrile is higher than 25%, then thermal resistance is deteriorated.

Figure 1:
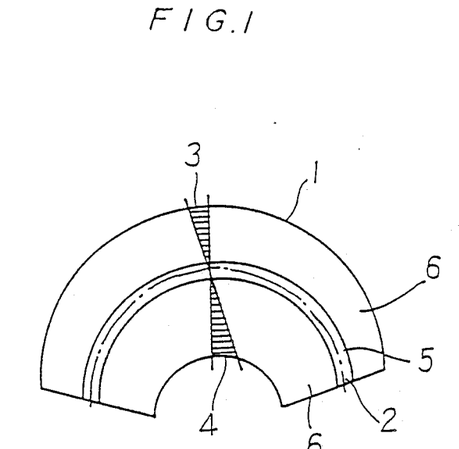
FIG. 1 illustrates a distribution of stress to layers of a laminate constructed in accordance with the invention when it is bent.

FIG. 1 illustrates distribution of stress when the laminate 1 was bent. As noted from FIG. 1, the distribution of stress when the laminate 1 was bent has pulling stress area 3 and compressive stress area 4 divided on a protrusion side and a recessed side of the bent laminate by a center line 2. The stresses are larger toward the surfaces of the laminate 1. Thus, it will be noted that the layout of the invention in which a center layer 5 of glass fiber woven cloth is positioned at the central portion while expansible and compressible sheet-like bases 6 suitable for bending are positioned on both faces of the glass fiber woven cloth 5 is most suitable for accomplishing the good bending characteristic which is the object of the invention.

Composite of epoxy resin having more than two functional groups with which the central layer 5 of glass fiber woven cloth is impregnated serves to prevent the laminate from having much flexion while it holds the bending characteristic when it is subject to high temperature treatment such as automatic soldering process because the epoxy resin composite has high glass transference temperature of about 130° C.

BRIEF DESCRIPTION OF THE DRAWING

The above and other objects and features of the invention will be apparent from the description of embodiments of the invention which is taken along with reference to the accompanying drawing in which;

and FIG. 2 A and B illustrates how the bending characteristic of the laminate is measured.

DETAILED DESCRIPTION OF EMBODIMENT

As shown in FIG. 1, an epoxy resin laminate of the invention comprises a center base layer 5 of glass fiber woven cloth and outer base layers 6 and 6 of sheet-like material more expansible and compressible than the center layer 5 of glass fiber woven cloth provided on both faces of the center base layer 5. The outer base layers 6 and 6 are integrally impregnated with a composition produced by reacting 5 to 60 weight parts of polybutadiene-acrylonitrile copolymer having carboxyl groups at its terminal with 95 to 40 weight parts of epoxy resin having more than two functional groups. The center base layer 5 of glass fiber woven cloth may be preferably impregnated with epoxy resin having more than two functional groups.

The glass fiber woven cloth used for the invention is not intended to be defined only to conventional one for electrical insulation. In general, the cloth may be plain fabrics of E glass yarns. Also, although the expansible and compressible sheet-like base layer 6 and 6 may be conventional ones for electrical insulation, they are not intended to be defined thereto so long as they are more expansible and compressible than the glass fiber woven cloth. They may be preferably of organic fiber having pulling expansion of more than 5% and thermal resistance, for example, but they are not limited thereto. They may be preferably of polyester fiber, aramid fiber, polyamide fiber, phenol fiber or the like, for example. Binder by which the fibers are bonded to each other may be of epoxy resin, polyvinyl alcohol, acrylonitrile or pulp, for example.

Epoxy resin having more than two functional groups used for the invention may be conventional one such as bisphenol A type or bisphenol F type epoxy resin or epoxidated novolak resin, but it is not defined thereto. Epoxy resin may be bromated in order to make the laminate nonflammable. Nonflammable additives such as antimony trioxide, antimony pentoxide, phosphorous compound, aluminium hydroxide or magnesium hydroxide may be added.

Metal foil used for the invention may be copper foil, nickel foil or aluminium foil, but it is not limited thereto.

In Examples 1 through 3, there were used expansible and compressible sheet-like base layer of organic fiber nonwoven cloth.

Examples 1 to 3 and Comparisons 1 and 2

Polybutadien-acrylonitrile copolymer having carboxyl groups at both ends (tradename of CTBN 1300×8 manufactured by Ube Kosan Company, Japan) was reacted at a temperature of 180° C. for 4 hours with nonflammable epoxy resin (tradename of YDB-400 manufactured by Tohto Kasei Company, Japan, epoxy equivalent of 400 and bromine inclusion ratio of 48%), epoxy resin (tradename of Ep-828 manufactured by Yuka Shell Company, Japan, epoxy equivalent of 195) and cresol novolak epoxy resin (tradename of YDCN-704 manufactured by Tohto Kasei Company, Japan, epoxy equivalent of 210) with catalyst of triphenyl phosphine while they are blended as indicated in Table 1. This reactant was blended with dicyandiamide to produce varnish.

Glass fiber woven cloth and aramid fiber nonwoven cloth (weighing 35 g/m$^2$) were impregnated with the resultant varnish, respectively and then dried to produce prepregs. After copper foils of 35 μm thickness were disposed on aramid fiber nonwoven cloth prepregs disposed on both faces of glass fiber woven cloth prepreg, they are thermally pressurized to provide a both face copper foil overed laminate of thickness of 0.6 mm.

Figure 2A:
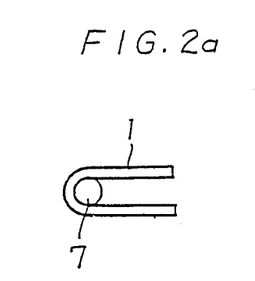
Figure 2B:
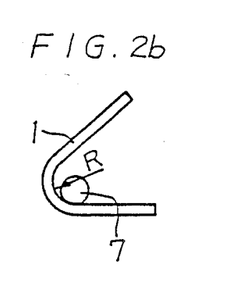

Table 1 also shows the characteristics of the laminates. In the tests of characteristic, copper peeling strength (referred to as "CPS" in the table) was made in accordance with JIS-C-6481 and appreciated by kg/cm. Thermal resistance to soft solder (referred to as "TRS" in the table) was appreciated by measuring the days for which the materials were held at an atmosphere having a temperature of 40° C. and a humidity of 90% as they were and then they were not found to be in bad condition even though they were floating on soft solder of 260° C. for 30 seconds. Size stability (referred to as "SS" in the table) was appreciated by removing copper foils out of the materials by etching, treating them by E-0.5/150 and measuring difference (%) between the sizes before and after the treatment of them. Chemical resistance (referred to as "CR" in the table) was appreciated by observing the condition of the materials after they were treated by methylene chloride of 40° C. for 3 minutes. In this test, " " designates that there was no abnormal condition and "Δ" designates that there was roughness on the surface. Bending characteristic (referred to as "BC" in the table) was appreciated by winding the laminate around a cylindrical rod 7 as shown in FIG. 2a and measuring a radius R (mm) of the bent condition of the laminate after the bending stress was relieved as shown in FIG. 2b. It should be noted that the cylindrical rod 7 was so set as to have a radius sufficiently small to generate no cracks. In the table 1, "Ex" designates Example, "CP" designates Comparison, "RC" designates resin composite (weight parts), "CRT" designates various characteristics.

TABLE I

|  | Ex 1 | Ex 2 | Ex 3 | CP 1 | CP 2 |
| --- | --- | --- | --- | --- | --- |
| (RC) | | | | | |
| CTBN 1300 × 8 | 30 | 30 | 50 | — | 80 |
| YDB-400 | 40 | 40 | 40 | 40 | 20 |
| Ep-828 | 20 | 30 | 5 | 60 | — |
| YDCN-704 | 10 | — | 5 | — | — |
| dicyandiamide | 3 | 3 | 2 | 5.5 | 0.1 |
| (CRT) | | | | | |
| CPS (kg/cm) | 2.2 | 2.2 | 2.6 | 2.4 | 1.6 |
| TRS (days) | 138 | 112 | 100 | 139 | 25 |
| SS (%) | 0.06 | 0.06 | 0.06 | 0.05 | 0.10 |
| CR ( or Δ) | | | | | Δ |
| BC (mm) | 10 | 12 | 8 | 28 (crack found) | 22 |

Comparison 3

Three aramid fiber nonwoven cloth prepregs used in Example 1 were superposed each on other and adhered to each other and copper foils of 35 μm thickness were disposed on both faces of the adhered aramid fiber nonwoven cloth prepregs to provide a both face copper foil overed laminate of thickness of 0.6 mm.

Comparison 4

Three glass fiber woven cloth prepregs used in Example 1 were superposed each on other and adhered to each other and copper foils of 35 μm thickness were disposed on both faces of the adhered glass fiber nonwoven cloth prepregs to provide a both face copper foil overed laminate of thickness of 0.6 mm.

Comparison 5

100 weight parts of nonflammable epoxidated dimer acid (manufactured by Dainihon Ink Company, Japan, epoxy equivalent of 750) was blended with 4 weight parts of dicyandiamide to produce varnish. Glass fiber woven cloth and aramid fiber nonwoven cloth used in Example 1 were impregnated with the varnish and dried to produce prepregs. The prepregs were thermally pressurized in the same manner as described on Example 1 to provide a both face copper foil overed laminate of thickness of 0.6 mm.

Comparison 6

30 weight parts of polybutadien-acrylonitrile copolymer having carboxyl groups at both ends (tradename of CTBN 1300×8 manufactured by Ube Kosan Company, Japan) was blended with 40 weight parts of nonflammable epoxy resin (tradename of YDB-400 manufactured by Tohto Kasei Company, Japan, epoxy equivalent of 400 and bromine inclusion ratio of 48%), 30 weight parts of epoxy resin (tradename of Ep-828 manufactured by Yuka Shell Company, Japan, epoxy equivalent of 195) while 3 weight parts of dicyandiamide was added to produce varinish.

Glass fiber woven cloth and aramid fiber nonwoven cloth used in Example 1 were impregnated with the varnish and dried to produce prepregs. The prepregs were thermally pressurized in the same manner as described on Example 1 to provide a both face copper foil overed laminate of thickness of 0.6 mm.

A table II indicates the result of characteristic tests of the laminates of Comparisons 3 through 6. The same abbreviations have the same

TABLE II

|  | CP 3 | CP 4 | CP 5 | CP 6 |
|---|---|---|---|---|
| CPS (kg/cm) | 2.2 | 2.1 | 1.4 | 1.4 |
| TRS (days) | 96 | 131 | 86 | 70 |
| SS (%) | 0.16 | 0.05 | 0.08 | 0.07 |
| CR ( or Δ) |  |  | Δ | Δ |
| BC (mm) | 16 | 60 | 10 | 19 |
|  |  | (crack found) |  |  |

Comparisons 7 and 8

Polybutadien-acrylonitrile copolymer having carboxyl groups at both ends (tradename of CTBN manufactured by Ube Kosan Company, Japan) was reacted at a temperature of 180° C. for 4 hours with epoxy resins used in Examples 1 through 3 with catalyst of triphenyl phosphine while they are blended as indicated in Table III. This reactant was blended with dicyandiamide to produce varnish.

These varnishes were used to produce both face copper foil covered laminates of 0.6 mm thickness in the same manner as described on Example 1.

The table III also indicates the results of characteristic tests of the laminates of Comparisons 7 and 8 together with that of Example 2. In the table, the same abbreviation has the same meaning while "PSE" designates phase solution with epoxy resin.

TABLE III

|  | CP 7 | Ex 2 | CP 8 |
|---|---|---|---|
| (RC) |  |  |  |
| CTBN 1300 × 162 | 30 | — | — |
| CTBN 1300 × 8 | — | 30 | — |
| CTBN 1300 × 13 | — | — | 30 |
| YDB-400 | 40 | 40 | 40 |
| Ep-828 | 30 | 30 | 30 |
| YDCN-704 | 10 | — | 5 |
| dicyandiamide | 3 | 3 | 3 |
| (CRT) |  |  |  |
| PSE | muddy | good | good |
| CPS (kg/cm) | — | 2.2 | 2.4 |
| TRS (days) | — | 112 | 72 |
| SS (%) | — | 0.06 | 0.05 |
| CR ( or Δ) | — |  |  |
| BC (mm) | — | 12 | 10 |

In the table III, CTBN1300×162 has a ratio of acrylonitrile bonding of 0%, CTBN1300×8 has a ratio of acrylonitrile bonding of 17% and CTBN1300×13 has a ratio of acrylonitrile bonding of 27%.

In Examples 4 through 6, there were used the expansible and compressible sheet-like base of organic fiber woven cloth.

Examples 4 through 6 and Comparisons 9 and 10

Polyester fiber woven cloth of plain fabrics having a thickness of 0.18 mm was used in place of aramid fiber nonwoven cloth of Examples 1 through 3 and Comparisons 1 and 2 to produce a both face copper foil covered laminate in the same manner as described on these Examples and Comparisons.

A table IV indicates the results of characteristic tests of the laminates of Examples 4 through 6 and Comparisons 9 and 10. In the Table IV, the same abbreviations have the same meanings.

TABLE IV

|  | Ex 4 | Ex 5 | Ex 6 | CP 9 | CP 10 |
|---|---|---|---|---|---|
| CPS (kg/cm) | 2.2 | 2.2 | 2.6 | 2.4 | 1.6 |
| TRS (days) | 140 | 122 | 98 | 138 | 27 |
| SS (%) | 0.03 | 0.04 | 0.03 | 0.03 | 0.06 |
| CR ( or Δ) |  |  |  |  | Δ |
| BC (mm) | 5 | 4 | 5 | 26 | 20 |

In Examples 7 and 8, there were used the expansible and compressible sheet-like base of glass and organic fiber combined nonwoven cloth.

Examples 7 and 8 and Comparisons 11 and 12

Polybutadien-acrylonitrile copolymer having carboxyl groups at both ends (tradename of CTBN 1300×8 manufactured by Ube Kosan Company, Japan) was reacted at a temperature of 180° C. for 4 hours with nonflammable epoxy resin (tradename of YDB-400 manufactured by Tohto Kasei Company, Japan, epoxy equivalent of 400 and bromine inclusion ratio of 48%) and epoxy resin (tradename of Ep-828 manufactured by Yuka Shell Company, Japan, epoxy equivalent of 195) with catalyst of triphenyl phosphine while they are blended as indicated in Table V. This reactant was blended with 60 weight parts of adipic acid to produce varnish.

Glass fiber woven cloth and glass fiber/aramid fiber combined nonwoven cloth (weighing 35 g/m$^2$) were impregnated with the resultant varnish, respectively and then dried to produce prepregs. After copper foils of 35 μm thickness were disposed on glass fiber/aramid fiber combined nonwoven cloth prepregs disposed on both faces of glass fiber woven cloth prepreg, they were thermally pressurized to provide a both face copper foil overed laminate of thickness of 0.6 mm.

The Table V also shows the characteristics of the laminates of Examples 7 and 8 and Comparisons 11 and 12. In the table V, the same abbreviations have the same meanings.

TABLE V

|  | Ex 7 | Ex 8 | CP 11 | CP 12 |
|---|---|---|---|---|
| (RC) |  |  |  |  |
| CTBN 1300 × 8 | 30 | 50 | 0 | 80 |
| YDB-400 | 40 | 40 | 40 | 20 |
| Ep-828 | 30 | 10 | 60 | 0 |
| (CRT) |  |  |  |  |
| CPS (kg/cm) | 2.2 | 2.6 | 2.4 | 1.6 |
| SS (%) | 0.05 | 0.06 | 0.04 | 0.08 |
| CR ( θ or Δ) |  |  |  | Δ |
| BC (mm) | 12 | 11 | 32 | 32 |
|  |  |  | (crack found) |  |

Comparison 13

Three prepregs of glass fiber/aramid fiber combined nonwoven cloth used in Example 7 were superposed each on other and adhered to each other and a both face copper foil covered laminate of 0.6 mm thickness was produced in the same manner as described on Example 7.

Comparison 14

Three prepregs of glass fiber woven cloth used in Example 7 were superposed each on other and adhered to each other and a both face copper foil covered laminate of 0.6 mm thickness was produced in the same manner as described on Example 7.

Comparison 15

100 weight parts of nonflammable epoxidated dimer acid (manufactured by Dainihon Ink Company, Japan, epoxy equivalent of 400) was blended with 60 weight parts of adipic acid to produce varnish. Glass fiber woven cloth and glass fiber/aramid fiber combined nonwoven cloth used in Example 7 were impregnated with the varnish and dried to produce prepregs. The prepregs were thermally pressurized in the same manner as described on Example 7 to provide a both face copper foil overed laminate of thickness of 0.6 mm.

A table VI indicates the results of characteristic tests of the laminates of Comparisons 13 through 15.

TABLE VI

|  | CP 13 | CP 14 | CP 15 |
|---|---|---|---|
| CPS (kg/cm) | 2.2 | 2.1 | 1.4 |
| SS (%) | 0.11 | 0.05 | 0.07 |
| CR ( or Δ) |  |  | Δ |
| BC (mm) | 20 | 60 | 14 |

In Examples 9 and 10, there were used the expansible and compressible sheet-like base of glass fiber and organic fiber combined woven cloth.

Examples 9 and 10 and Comparisons 16 and 17

Glass fiber/aramid fiber combined woven cloth was used in place of glass fiber/aramid fiber combined nonwoven cloth of Examples 7 and 8 and Comparisons 11 and 12 to produce a both face copper foil covered laminate of 0.6 mm thickness in the same manner as described on these Examples and Comparisons.

Comparison 18

Three glass fiber/aramid fiber combined woven cloth prepregs used in Example 9 were superposed each upon other and sticked to each other and a both face copper foil covered laminate of 0.6 mm thickness was produced in the same manner as described on Example 9.

A table VII indicates the results of characteristic tests of the laminates of Examples 9 and 10 and Comparisons 16 through 18. In the Table VII, the same abbreviations have the same meanings.

TABLE VII

|  | Ex 9 | Ex 10 | CP 16 | CP 17 | CP 18 |
|---|---|---|---|---|---|
| CPS (kg/cm) | 2.2 | 2.6 | 2.4 | 1.6 | 2.2 |
| SS (%) | 0.05 | 0.06 | 0.04 | 0.08 | 0.11 |
| CR ( or Δ) |  |  |  | Δ |  |
| BC (mm) | 12 | 11 | 32 | 32 | 20 |
|  |  |  | (crack found) |  |  |

In Examples 11 and 13, there were used the expansible and compressible sheet-like base of glass fiber nonwoven cloth.

Examples 11 through 13 and Comparisons 19 and 20

Glass fiber nonwoven cloth was used in place of aramid fiber nonwoven cloth of Examples 1 through 3 and Comparisons 1 and 2 to produce a both face copper foil covered laminate of 0.6 mm thickness in the same manner as described on these Examples and Comparisons.

Comparison 21

Three prepregs produced by impregnating glass fiber-including polyester fiber nonwoven cloth with varnish used in Example 11 were superposed each upon other and adhered to each other and copper foils of 35 μm were displaced on both faces of the adhered prepregs while they are thermally pressurized to produce a both face copper foil covered laminate of 0.6 mm thickness.

A table VIII indicates the results of characteristic tests of the laminates of Examples 11 through 13 and Comparisons 19 through 21. In the Table IV, the same abbreviations have the same meanings.

TABLE VIII

|  | Ex 11 | Ex 12 | Ex 13 | CP 19 | CP 20 | CP 21 |
|---|---|---|---|---|---|---|
| CPS (kg/cm) | 2.2 | 2.2 | 2.6 | 2.4 | 1.6 | 2.2 |
| TRS (days) | 135 | 118 | 102 | 132 | 30 | 96 |
| SS (%) | 0.05 | 0.04 | 0.06 | 0.04 | 0.12 | 0.16 |
| CR ( or Δ) |  |  |  |  | Δ |  |
| BC (mm) | 19 | 19 | 17 | 45 | 31 | 16 |
|  |  |  |  | (crack found) |  |  |

In Example 14 through 16, there was used the center base layer of glass fiber woven cloth impregnated with epoxy resin composite having more than two functional groups.

Examples 14 through 16 and Comparisons 22 and 23

90 weight parts of nonflammable epoxy resin (tradename of YDB-500 manufactured by Tohto Kasei Company, Japan, epoxy equivalent of 500 and bromine inclusion ratio of 22%) was blended with 10 weight parts of cresol novolak epoxy resin (tradename of YDCN-704 manufactured by Tohto Kasei Company, Japan, epoxy equivalent of 210) and 3 weight parts of dicyandiamide to produce varnish and glass fiber woven cloth was impregnated with the varnish and dried to produce a prepreg.

After copper foils of 35 μm thickness were disposed on aramid fiber nonwoven cloth prepregs used in Examples 1 through 3 and Comparisons 1 and 2 which were disposed on both faces of the aforementioned glass fiber woven cloth prepreg, they were thermally pressurized to provide a both face copper foil overed laminate of thickness of 0.6 mm.

Table IX shows the characteristics of the resultant laminates. In the table IX, the same abbreviations have the same meanings. Also, in the table, "FCH" is referred to as flexion characteristic at high temperature and was appreciated by measuring the quantity of flexure the test materials which were displaced with a span of 300 mm at a temperature of 150° C.

TABLE IX

|  | Ex 14 | Ex 15 | Ex 16 | CP 22 | CP 23 |
|---|---|---|---|---|---|
| CPS (kg/cm) | 2.2 | 2.2 | 2.6 | 2.4 | 1.6 |
| TRS (days) | 168 | 138 | 124 | 159 | 25 |
| SS (%) | 0.03 | 0.04 | 0.03 | 0.03 | 0.06 |
| FCH (mm) | 3 | 3 | 4 | 2 | 6 |
| BC (mm) | 11 | 13 | 10 | 95 | 22 |
|  |  |  |  | (crack found) |  |

In this connection, flexions of the laminates at high temperature in Comparisons 3 and 4 were 8 mm and 1 mm, respectively.

Comparison 24

Aramid fiber nonwoven cloth prepreg of Comparison 5 was used in place of aramid fiber nonwoven cloth prepreg of Example 14 and a both face copper foil covered laminate of 0.6 mm thickness was produced in the same manner as described on Example 14.

Comparison 25

Aramid fiber nonwoven cloth prepreg of Comparison 6 was used in place of aramid fiber nonwoven cloth prepreg of Example 14 and a both face copper foil covered laminate of 0.6 mm thickness was produced in the same manner as described on Example 14.

Table X shows the characteristics of the laminates of Comparisons 24 and 25. In the table X, the same abbreviations have the same meanings.

TABLE X

|  | CP 24 | CP 25 |
|---|---|---|
| CPS (kg/cm) | 1.4 | 1.4 |
| TRS (days) | 88 | 72 |
| SS (%) | 0.04 | 0.05 |
| FCH (mm) | 3 | 2 |
| BC (mm) | 18 | 25 |
|  |  | (crack found) |

Examples 17 through 19 and Comparisons 26 and 27

Glass fiber/aramid fiber combined nonwoven cloth (weighing 35 g/m²) was used in place of aramid fiber nonwoven cloth of Examples 14 through 16 and Comparisons 22 and 23 to produce a both face copper foil covered laminate of 0.6 mm thickness in the same manner as described on these Examples and Comparisons.

Table XI shows the characteristics of the resultant laminates. In the table XI, the same abbreviations have the same meanings.

TABLE XI

|  | Ex 17 | Ex 18 | Ex 19 | CP 26 | CP 27 |
|---|---|---|---|---|---|
| CPS (kg/cm) | 2.2 | 2.6 | 2.4 | 2.1 | 1.6 |
| TRS (days) | 178 | 146 | 132 | 161 | 64 |
| SS (%) | 0.03 | 0.04 | 0.03 | 0.03 | 0.05 |
| FCH (mm) | 2 | 3 | 3 | 1 | 4 |
| BC (mm) | 13 | 14 | 12 | 100 | 42 |
|  |  |  |  | (crack found) |  |

In this connection, flexion of the laminate having the same resin varnish as used for the glass fiber/aramid fiber combined nonwoven cloth outer layers of Example 17 and with which the glass fiber woven cloth center layer of Example 17 was impregnated was 6 mm at high temperature.

Comparison 28

Three prepregs of glass fiber/aramid fiber combined nonwoven cloth used in Example 17 were superposed each upon other and adhered to each other and copper foils of 35 μm were displaced on both faces of the adhered prepregs to produce a both face copper foil covered laminate of 0.6 mm thickness in the same manner as described on Example 17.

Comparison 29

A prepreg of glass fiber/aramid fiber combined nonwoven cloth impregnated with varnish of Comparison 5 was used in place of the prepreg of glass fiber/aramid combined nonwoven cloth of Example 17 to produce a both face copper foil covered laminate of 0.6 mm thickness in the same manner as described on Example 17.

Comparison 30

A prepreg of glass fiber/aramid fiber combined nonwoven cloth impregnated with varnish of Comparison 6 was used in place of the prepreg of glass fiber/aramid combined nonwoven cloth of Example 17 to produce a both face copper foil covered laminate of 0.6 mm thickness in the same manner as described on Example 17.

Table XII shows the characteristics of the laminates of Comparisons 28 through 30. In the table XI, the same abbreviations have the same meanings.

TABLE XII

|  | CP 28 | CP 29 | CP 30 |
|---|---|---|---|
| CPS (kg/cm) | 2.2 | 1.4 | 1.4 |
| TRS (days) | 100 | 88 | 72 |
| SS (%) | 0.20 | 0.04 | 0.05 |
| FCH (mm) | 12 | 4 | 4 |
| BC (mm) | 19 | 26 | 28 |
|  |  | (crack found) |  |

Examples 20 through 22 and Comparisons 31 and 32

Glass fiber nonwoven cloth (weighing 35 g/m²) was used in place of aramid fiber nonwoven cloth of Examples 14 through 16 and Comparisons 22 and 23 to produce a both face copper foil covered laminate of 0.6 mm thickness in the same manner as described on these Examples and Comparisons.

Table XIII shows the characteristics of the resultant laminates. In the table XI, the same abbreviations have the same meanings.

TABLE XIII

|  | Ex 20 | Ex 21 | Ex 22 | CP 31 | CP 32 |
|---|---|---|---|---|---|
| CPS (kg/cm) | 2.2 | 2.4 | 2.5 | 2.2 | 1.8 |
| TRS (days) | 185 | 158 | 136 | 156 | 30 |
| SS (%) | 0.04 | 0.05 | 0.03 | 0.04 | 0.04 |
| FCH (mm) | 2 | 2 | 2 | 1 | 3 |
| BC (mm) | 23 | 24 | 18 | 110 | 56 |
|  |  |  | (crack found) |  |  |

In this connection, flexion of the laminate having the same resin varnish as used for the glass fiber nonwoven cloth outer layers of Example 20 and with which the glass fiber woven cloth center layer of Example 20 was impregnated was 5 mm at high temperature.

Comparison 33

Three prepregs of glass fiber nonwoven cloth used in Example 20 were superposed each upon other and adhered to each other and copper foils of 35 μm were displaced on both faces of the adhered prepregs to produce a both face copper foil covered laminate of 0.6 mm thickness in the same manner as described on Example 20.

Comparison 34

A prepreg of glass fiber nonwoven cloth impregnated with varnish of Comparison 5 was used in place of the prepreg of glass fiber nonwoven cloth of Example 20 to produce a both face copper foil covered laminate of 0.6 mm thickness in the same manner as described on Example 20.

Comparison 35

Prepregs of glass fiber woven cloth and glass fiber nonwoven cloth impregnated with varnish of Comparison 6 were prepared and the prepregs of glass fiber nonwoven cloth were displaced on both faces of the prepreg of glass fiber woven cloth. A both face copper foil covered laminate of 0.6 mm thickness was provided by displacing copper foils on both faces of the adhered prepregs and thermally pressurizing them.

Table XIV shows the characteristics of the laminates of Comparisons 33 through 35. In the table XIV, the same abbreviations have the same meanings.

TABLE XIV

|  | CP 33 | CP 34 | CP 35 |
|---|---|---|---|
| CPS (kg/cm) | 2.2 | 1.4 | 1.4 |
| TRS (days) | 98 | 86 | 79 |
| SS (%) | 0.16 | 0.08 | 0.06 |
| FCH (mm) | 8 | 3 | 3 |
| BC (mm) | 19 | 32 | 38 |

Examples 23 through 25 and Comparisons 36 and 37

Glass fiber/aramid fiber combined woven cloth was used in place of aramid fiber nonwoven cloth of Examples 14 through 16 and Comparisons 22 and 23 to produce a both face copper foil covered laminate of 0.6 mm thickness in the same manner as described on these Examples and Comparisons.

Table XV shows the characteristics of the resultant laminates. In the table XV, the same abbreviations have the same meanings.

TABLE XV

|  | Ex 23 | Ex 24 | Ex 25 | CP 36 | CP 37 |
|---|---|---|---|---|---|
| CPS (kg/cm) | 2.2 | 2.5 | 2.3 | 2.1 | 1.6 |
| TRS (days) | 174 | 142 | 130 | 161 | 64 |
| SS (%) | 0.03 | 0.04 | 0.03 | 0.03 | 0.05 |
| FCH (mm) | 2 | 3 | 3 | 1 | 4 |
| BC (mm) | 12 | 13 | 11 | 100 | 42 |
|  |  |  | (crack found) |  |  |

In this connection, flexion of the laminate having the same resin varnish as used for the glass fiber/aramid fiber combined woven cloth outer layers of Example 23 and with which the glass fiber woven cloth center layer of Example 23 was impregnated was 6 mm at high temperature.

Comparison 38

Three prepregs of glass fiber/aramid fiber combined woven cloth used in Example 23 were superposed each upon other and adhered to each other and copper foils of 35 μm were displaced on both faces of the adhered prepregs to produce a both face copper foil covered laminate of 0.6 mm thickness in the same manner as described on Example 23.

Comparison 39

A prepreg of glass fiber/aramid fiber combined woven cloth impregnated with varnish of Comparison 5 was used in place of the prepreg of glass fiber/aramid combined woven cloth of Example 23 to produce a both face copper foil covered laminate of 0.6 mm thickness in the same manner as described on Example 23.

Comparison 40

A prepreg of glass fiber/aramid fiber combined woven cloth impregnated with varnish of Comparison 6 was used in place of the prepreg of glass fiber/aramid combined woven cloth of Example 23 to produce a both face copper foil covered laminate of 0.6 mm thickness in the same manner as described on Example 23.

Table XVI shows the characteristics of the laminates of Comparisons 38 through 40. In the table XVI, the same abbreviations have the same meanings.

TABLE XVI

|  | CP 38 | CP 39 | CP 40 |
|---|---|---|---|
| CPS (kg/cm) | 2.2 | 1.4 | 1.4 |
| TRS (days) | 100 | 88 | 72 |
| SS (%) | 0.20 | 0.04 | 0.05 |
| FCH (mm) | 12 | 4 | 4 |
| BC (mm) | 19 | 26 | 28 |
|  |  | (crack found) |  |

As noted from Examples and Comparisons, with the center layer of glass fiber woven cloth having sheet-like base outer layers of material more expansible and compressible than the material of the center layer and specific resins with which the assembly of layers are impregnated, there can be provided a laminate having less flexure and excellent size stability and adapted to be used in a bent condition. In addition thereto, the thus produced laminate has excellent chemical resistance and strength of bonding to a metal foil, which enables a high density printed circuit board to be provided.

Furthermore, it should be noted that with the center layer of glass fiber woven cloth impregnated with composite of epoxy resin having more than two functional groups, flexion of the laminate on soldering process at high temperature can be effectively prevented.

Although many examples of the invention have been described, it will be understood by those skilled in the art that various changes and modifications may be made without departing from the spirit and scope of the invention, which is intended to be defined only to the appended claims.

What is claimed is:

1. An epoxy resin laminate comprising a center base layer of glass fiber woven cloth and outer base layers of sheet-like material more expansible and compressible than said glass fiber woven cloth provided on both faces of said center base layer and integrally impregnated with a composition produced by reacting 5 to 60 weight parts of polybutadiene-acrylonitrile copolymer having carboxyl groups at its terminal with 95 to 40 weight parts of epoxy resin having more than two functional groups.

2. An epoxy resin laminate as set forth claim 1, and wherein said outer base layers of sheet-like material are of organic fiber.

3. An epoxy resin laminate as set forth claim 1, and wherein said outer base layers of sheet-like material are of composite of organic fiber and glass fiber.

4. An epoxy resin laminate as set forth claim 1, and wherein said outer base layers of sheet-like material are formed of nonwoven cloth.

5. An epoxy resin laminate as set forth claim 1, and wherein said outer base layers of sheet-like material are formed of woven cloth.

6. An epoxy resin laminate as set forth claim 1, and wherein said outer base layers of sheet-like material are formed of glass fiber nonwoven cloth.

7. An epoxy resin laminate comprising;
a center base layer of glass fiber woven cloth impregnated with epoxy resin having more than two functional groups;
and outer base layers of sheet-like material more expansible and compressible than said glass fiber woven cloth provided on both faces of said center base layer and integrally impregnated with a composition produced by reacting 5 to 60 weight parts of polybutadiene-acrylonitrile copolymer having carboxyl groups at its terminal with 95 to 40 weight parts of epoxy resin having more than two functional groups.

8. An epoxy resin laminate as set forth in claim 7, and wherein said outer base layers of sheet-like material are formed of nonwoven cloth.

9. An epoxy resin laminate as set forth in claim 8, and wherein said nonwoven cloth is organic fiber nonwoven cloth.

10. An epoxy resin laminate as set forth in claim 8, and wherein said nonwoven cloth is glass fiber and organic fiber combined nonwoven cloth.

11. An epoxy resin laminate as set forth in claim 8, and wherein said nonwoven cloth is glass fiber nonwoven cloth.

12. An epoxy resin laminate as set forth in claim 7, and wherein said outer base layers of sheet-like material are of glass fiber and organic fiber combined woven cloth.

13. An epoxy resin laminate as set forth in claim 1, and further comprising a metal foil attached to at least one of said outer base layers.

14. An epoxy resin laminate as set forth in claim 7, and further comprising a metal foil attached to at least one of said outer base layers.

* * * * *

UNITED STATES PATENT AND TRADEMARK OFFICE
CERTIFICATE OF CORRECTION

PATENT NO. : 4,913,955
DATED : April 3, 1990
INVENTOR(S) : Masayuki Noda et al.

It is certified that error appears in the above-identified patent and that said Letters Patent is hereby corrected as shown below:

Column 2, line 51, "pulling" should be --tension--.

Column 2, line 63, "Composite" should be --A composition--.

Column 3, line 12, "FIG." should be --FIGS.--.

Column 3, line 15, "DETAILED DESCRIPTION OF EMBODIMENT" should be --DESCRIPTION OF THE PREFERRED EMBODIMENTS--.

Column 3, line 31, "to" should be --by--.

Column 3, line 31, "one" should be --oms--.

Column 3, line 36, "thereto" should be --thereby--.

Column 3, line 40, "limitted" should be --limited--.

Column 3, line 49, "defined" should be --limited--.

Column 3, line 53, "aluminium" should be --aluminum--.

Column 3, line 56, "aluminium" should be --aluminum--.

Column 3, line 56, "limitted" should be --limited--.

Column 4, line 18, "overed" should be --covered--.

Column 4, line 39, " " should be -- ⓞ --.

UNITED STATES PATENT AND TRADEMARK OFFICE
CERTIFICATE OF CORRECTION

PATENT NO. : 4,913,955

DATED : April 3, 1990

INVENTOR(S) : Masayuki Noda et al.

It is certified that error appears in the above-identified patent and that said Letters Patent is hereby corrected as shown below:

Column 4, line 48, "small" should be --large--.

Column 4, line 65, in the row designated "CR" insert -- ⊚ -- before "or".

Column 4, line 65, in the row designated "CR" insert -- ⊚ -- at columns Ex 1, Ex 2, Ex 3 and CP1.

Column 5, line 8, "overed" should be --covered--.

Column 5, line 16, "overed" should be --covered--.

Column 5, line 27, "overed" should be --covered--.

Column 5, line 48, "overed" should be covered--.

Column 5, line 51, after "same" insert --meanings--.

Column 5, line 57, in the row designated "CR" insert -- ⊚ -- before "or".

Column 5, line 57, in the row designated "CR" insert -- ⊚ -- at columns CP 3 and CP 4.

Column 6, line 25, in the row designated "CR" insert -- ⊚ -- before "or".

Column 6, line 25, in the row designated "CR" insert -- ⊚ -- at columns Ex 2 and CP 8.

UNITED STATES PATENT AND TRADEMARK OFFICE
CERTIFICATE OF CORRECTION

PATENT NO. : 4,913,955

DATED : April 3, 1990

INVENTOR(S) : Masayuki Noda et al.

It is certified that error appears in the above-identified patent and that said Letters Patent is hereby corrected as shown below:

Column 6, line 53, in the row designated "CR" insert -- ⊚ -- before "or".

Column 6, line 53, in the row designated "CR" insert -- ⊚ -- at columns Ex 4, Ex 5, Ex 6 and CP 9.

Column 7, line 14, "overed" should be --covered--.

Column 7, line 29, " " should be -- ⊚ --.

Column 7, line 29, in the row designated "CR" insert -- ⊚ -- at columns Ex 7, Ex 8 and CP 11.

Column 7, line 36, "each on" should be --on each--.

Column 7, line 43, "each on" should be --on each--.

Column 7, line 59, "overed" should be --covered--.

Column 7, line 66, in the row designated "CR" insert -- ⊚ -- before "or".

Column 7, line 66, in the row designated "CR" insert -- ⊚ -- at columns CP 13 and CP 14.

Column 8, line 16, after "superposed" insert --on--.

Column 8, line 16, delete "upon".

UNITED STATES PATENT AND TRADEMARK OFFICE
CERTIFICATE OF CORRECTION

PATENT NO. : 4,913,955

DATED : April 3, 1990

INVENTOR(S) : Masayuki Noda et al.

It is certified that error appears in the above-identified patent and that said Letters Patent is hereby corrected as shown below:

Column 8, line 17, "sticked" should be --attached--.

Column 8, line 28, in the row designated "CR" insert -- ⓞ -- before "or".

Column 8, line 28, in the row designated "CR" insert -- ⓞ -- at columns Ex 9, Ex 10, CP 16 and CP 18.

Column 8, line 47, after "superposed" insert --on--.

Column 8, line 47, delete "upon".

Column 8, line 63, in the row designated "CR" insert -- ⓞ -- before "or".

Column 8, line 63, in the row designated "CR" insert -- ⓞ -- at Ex 11, Ex 12, Ex 13, CP 19 and CP 21.

Column 9, line 21, delete "overed" and insert --covered--.

Column 10, line 31, after "superposed" insert --on--.

Column 10, line 32, delete "upon".

Column 11, line 26, after "superposed" insert --on--.

Column 11, line 26, delete "upon".

Column 11, line 48, "displacing" should be --placing--.

UNITED STATES PATENT AND TRADEMARK OFFICE
CERTIFICATE OF CORRECTION

PATENT NO. : 4,913,955
DATED : April 3, 1990
INVENTOR(S) : Masayuki Noda et al.

It is certified that error appears in the above-identified patent and that said Letters Patent is hereby corrected as shown below:

Column 12, line 23, after "superposed" insert --on--.

Column 12, line 24, delete "upon".

Column 13, line 11, "to" (second occurrence) should be --by--.

Signed and Sealed this

Seventeenth Day of September, 1991

Attest:

HARRY F. MANBECK, JR.

Attesting Officer     Commissioner of Patents and Trademarks